(12) United States Patent
Lee et al.

(10) Patent No.: US 9,754,639 B2
(45) Date of Patent: Sep. 5, 2017

(54) MEMORY DEVICE AND REFERENCE CIRCUIT THEREOF

(71) Applicant: TAIWAN SEMICONDUCTOR MANUFACTURING CO., LTD., Hsinchu (TW)

(72) Inventors: Chia-Fu Lee, Hsinchu (TW); Yu-Der Chih, Hsinchu (TW); Hon-Jarn Lin, New Taipei (TW); Yi-Chun Shih, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/929,076

(22) Filed: Oct. 30, 2015

(65) Prior Publication Data
US 2017/0125071 A1    May 4, 2017

(51) Int. Cl.
G11C 7/06 (2006.01)
G11C 7/22 (2006.01)

(52) U.S. Cl.
CPC ............ *G11C 7/062* (2013.01); *G11C 7/22* (2013.01)

(58) Field of Classification Search
None
See application file for complete search history.

(56) References Cited

U.S. PATENT DOCUMENTS

| 6,388,932 | B2 * | 5/2002 | Kohno | G11C 7/062 365/203 |
| 6,700,811 | B1 * | 3/2004 | Weng | G11C 11/22 365/145 |
| 6,845,052 | B1 | 1/2005 | Ho et al. | |
| 7,054,197 | B2 | 5/2006 | Vimercati | |
| 2002/0163844 | A1 | 11/2002 | Kurjanowicz | |
| 2005/0157541 | A1 * | 7/2005 | Iwata | G11C 11/16 365/158 |
| 2006/0028889 | A1 | 2/2006 | Liaw | |
| 2006/0077740 | A1 * | 4/2006 | Lee | G11C 7/14 365/145 |
| 2006/0227598 | A1 * | 10/2006 | Sakimura | G11C 11/1673 365/158 |

(Continued)

FOREIGN PATENT DOCUMENTS

| JP | 2008-502091 A | 1/2008 |
| TW | 200741733 | 11/2007 |
| WO | 2006/027373 A1 | 3/2006 |

*Primary Examiner* — Son Dinh
*Assistant Examiner* — Uyen B Tran
(74) *Attorney, Agent, or Firm* — Maschoff Brennan

(57) ABSTRACT

A device is disclosed that includes memory cells, a reference circuit, and a sensing unit. Each of the memory cells is configured to store bit data. The reference circuit includes reference switches and reference storage units. The reference switches are disposed. A first reference storage unit of the reference storage units is configured to generate a first signal having a first logic state when a first reference switch the reference switches is turned on. A second reference storage unit of the reference storage units is configured to generate a second signal having a second logic state when a second reference switch of the reference switches is turned on. The sensing unit is configured to determine a logic state of the bit data of one of the memory cells according to the first signal and the second signal.

20 Claims, 8 Drawing Sheets

(56) References Cited

U.S. PATENT DOCUMENTS

| | | | |
|---|---|---|---|
| 2007/0195626 A1* | 8/2007 | Kim | G11C 7/14 |
| | | | 365/189.15 |
| 2007/0230263 A1* | 10/2007 | Sakakibara | G11C 7/02 |
| | | | 365/49.15 |
| 2009/0067212 A1 | 3/2009 | Shimizu | |
| 2014/0119105 A1 | 5/2014 | Jan et al. | |
| 2015/0262622 A1* | 9/2015 | Iizuka | G11C 5/06 |
| | | | 365/63 |
| 2015/0262701 A1 | 9/2015 | Takizawa | |
| 2015/0318033 A1* | 11/2015 | Kajigaya | G11C 11/1673 |
| | | | 714/764 |

* cited by examiner

US 9,754,639 B2

MEMORY DEVICE AND REFERENCE CIRCUIT THEREOF

BACKGROUND

Memory devices have been widely utilized in many applications. In various applications, the memory devices include a volatile memory and a non-volatile memory that is applicable for long term data storage. For example, the non-volatile memory includes the non-volatile memory includes an eFuse, an electrically-erasable programmable read-only memory (EEPROM), a flash memory, or a magneto resistive random-access memory (MRAM). A robust reference scheme is required to adequately read data stored in memory cells of the non-volatile memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
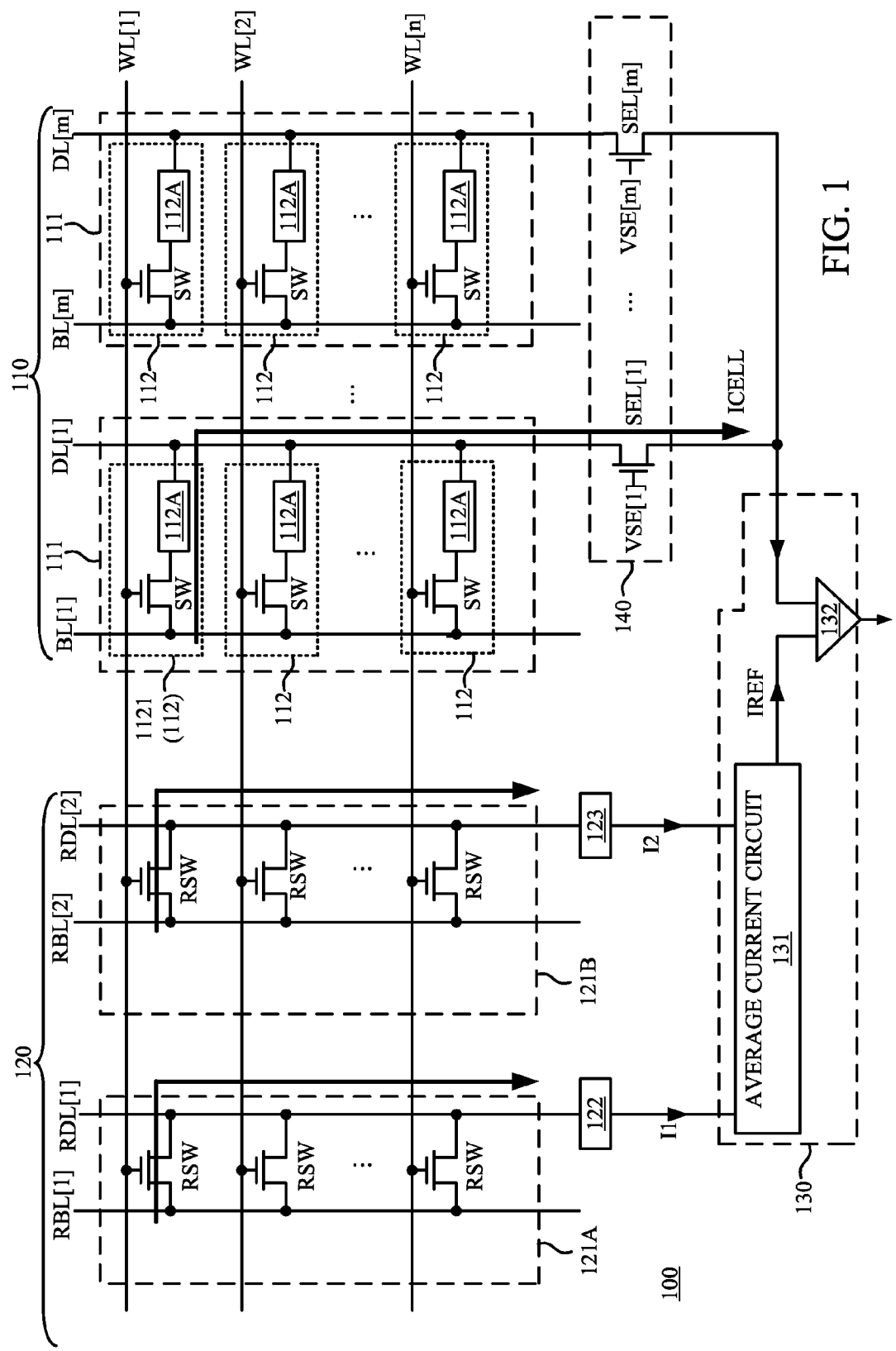
FIG. 1 is a schematic diagram of a device, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

FIG. 1 is a schematic diagram of an electronic device 100 in accordance with various embodiment of the present disclosure.

As illustratively shown in FIG. 1, the electronic device 100 includes a memory array 110, a reference circuit 120, a sensing unit 130, and a selection circuit 140. The memory array 110 includes memory columns 111, bit lines BL[1]-BL[m], word lines WL[1]-WL[n], and data lines DL[1]-DL[m], in which n and m are positive integers.

For illustration, the memory columns 111 are disposed in parallel with each other. Each memory column 111 includes n memory cells 112. Each n memory cells 112 includes a switch SW and a storage unit 112A. The switch SW is coupled to a corresponding one of the word lines WL[1]-WL[n] and a corresponding one of the bit lines BL[1]-BL[m]. The storage unit 112A is coupled between the switch SW and a corresponding one of the data lines DL[1]-DL[m]. Each of the storage units 112A is configured to store bit data.

The reference circuit 120 is disposed at a side of the memory array 110. The reference circuit 120 includes reference switches RSW, a reference storage unit 122, a reference storage unit 123, reference bit lines RBL[1]-RBL[2], and reference data lines RDL[1]-RDL[2]. The reference switches RSW are disposed in rows and columns. For illustration, the reference switches RSW are arranged in two columns 121A and 121B. First terminals of the reference switches RSW in the column 121A are coupled to the reference bit line RBL[1], second terminals of the reference switches RSW in the column 121A are coupled to the reference data line RDL[1], and control terminals of the reference switches RSW in the column 121A are coupled to the word lines WL[1]-WL[n], respectively. The reference storage unit 122 is coupled between the reference data line RDL[1] and the sensing unit 130, and configured to store bit data having a logic high state. Accordingly, when one of the reference switches RSW in the column 121A is turned on, the reference storage unit 122 is then biased to transmit the signal I1 having the logic high state according to the stored bit data. First terminals of the reference switches RSW in the column 121B are coupled to the reference bit line RBL[2], second terminals of the reference switches RSW in the column 121B are coupled to the reference data line RDL[2], and control terminals of the reference switches RSW in the column 121B are coupled to the word lines WL[1]-WL[n], respectively. The reference storage unit 123 is coupled between the reference data line RDL[2] and the sensing unit 130, and configured to store bit data having a logic low state. Accordingly, when one of the reference switches RSW in the column 121B is turned on, the reference storage unit 123 is then biased to generated signal I2 having the logic low state according to the stored bit data.

In some embodiments, the storage units 112A, the reference storage unit 122 and the reference storage unit 123 are implemented with non-volatile memory devices. In further embodiments, the non-volatile memory devices include resistive random-access memory (RRAM) device. The resistance of the RRAM device is able to be adjusted to present the bit data having the logic high state or the logic low state. In some other embodiments, the non-volatile memory devices include magnetic tunnel junction (MTJ) devices. The magneto resistance of the MTJ device is able to be adjusted to present the bit data having the logic high state or the logic low state.

The implementations of the storage units 112A, the reference storage unit 122 and the reference storage unit 123 are given for illustrative purposes only. Various implementations of the storage units 112A, the reference storage unit 122 and the reference storage unit 123 are within the contemplated scope of the present disclosure.

In some embodiments illustrated in FIG. 1, during a read operation, a corresponding one of the word lines WL[1]-WL[n] is activated. Accordingly, two reference switches RSW in the columns 121A and 121B, which are coupled to the activated one of the word lines WL[1]-WL[n], are turned on. The reference storage unit 122 then generates the signal I1 to the sensing unit 130, and the reference storage unit 123 then generates the signal I2 to the sensing unit 130. As a result, the sensing unit 130 is able to determine a logic state of the bit data of the selected one of the n memory cells 112 according to the signals I1 and I2. The detailed operations are described below with reference to FIG. 2.

Furthermore, the selection circuit 140 includes switches SEL[1]-SEL[m]. First terminals of the switches SEL[1]-SEL[m] are coupled to the data lines DL[1]-DL[m], respectively, second terminals of the switches SEL[1]-SEL[m] are coupled to the sensing unit 130, and control terminals of the switches SEL[1]-SEL[m] are configured to receive selection signals VSE[1]-VSE[m]. During the read operation, one of the switches SEL[1]-SEL[m] is turned on, and one of the word lines WL[1]-WL[n] is activated. Accordingly, the switch SW, which is coupled to the activated one of the word lines WL[1]-WL[n], are turned on by the corresponding one of the selection signals VSE[1]-VSE[m]. A current ICELL, indicating the bit data of the selected one of the n memory cells 112, is then transmitted to the sensing unit 130. Accordingly, the bit data of the selected memory cell 112 is able to be determined by the sensing unit 130.

The sensing unit 130 is coupled to the memory array 110 and the reference circuit 120. The sensing unit 130 is configured to determine the logic state of the bit data of the selected memory cell 112 according to the signals I1 and I2. For illustration, in some embodiments illustrated in FIG. 1, the sensing unit 130 includes an average current circuit 131 and a sense amplifier 132. Input terminals of the average current circuit 131 are coupled to the reference storage units 122 and 123 to receive the signals I1 and I2. A first input terminal of the sense amplifier 132 is coupled to an output terminal of the average current circuit 131 to receive a reference signal IREF. A second input terminal of the sense amplifier 132 is coupled to the switches SEL[1]-SEL[m] to receive the current ICELL. The average current circuit 131 is configured to average the signals I1 and I2 to generate the reference signal IREF. The sense amplifier 132 is configured to compare the reference signal IREF with the current ICELL, in order to determine the logic state of the bit data. In some embodiments, the average current circuit 131 is implemented with various types of current mirror circuit.

Figure 2:
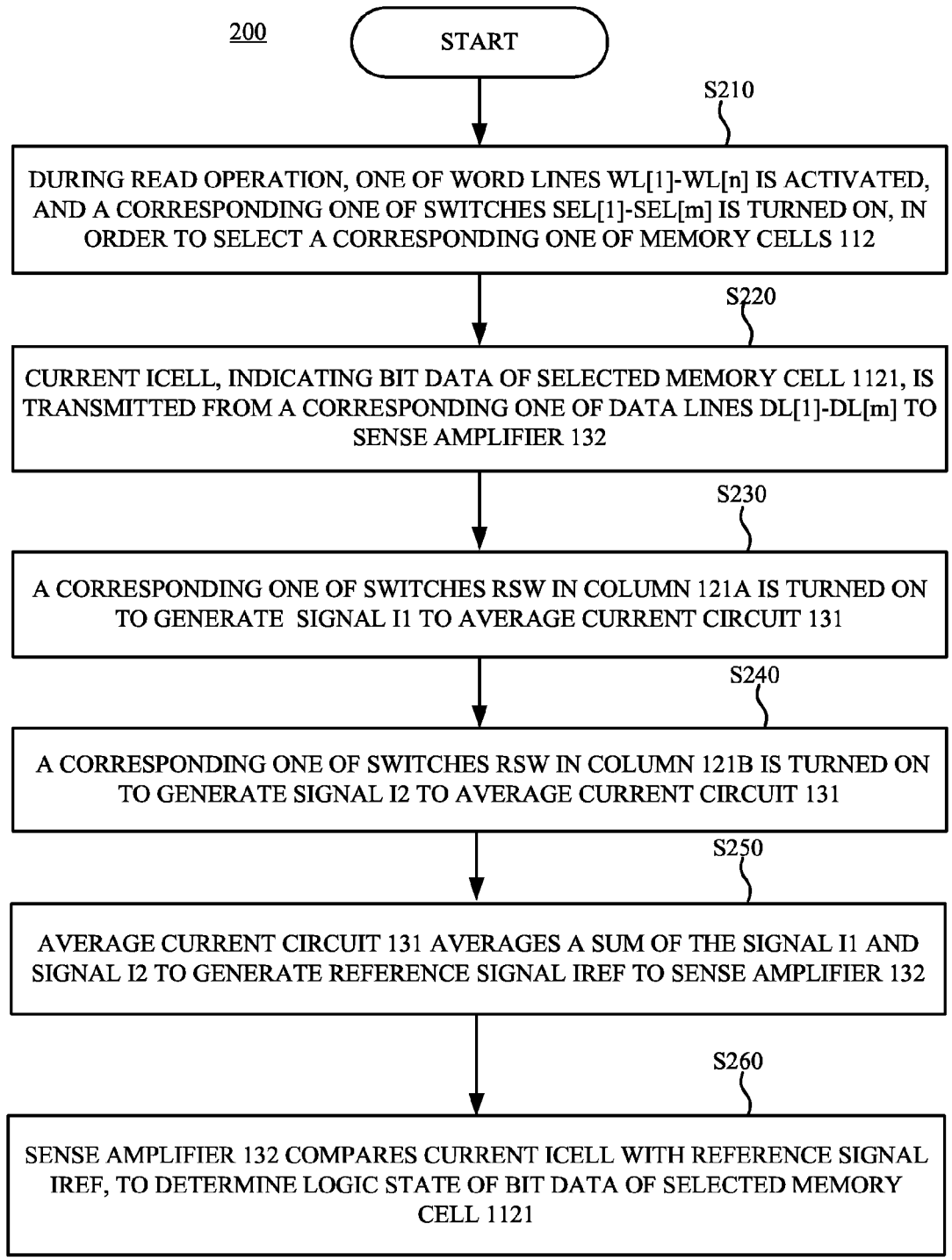
FIG. 2 is a flow chart of a method illustrating operations of the electronic device in FIG. 1, in accordance with various embodiments of the present disclosure.

FIG. 2 is a flow chart of a method 200 illustrating operations of the electronic device 100 in FIG. 1, in accordance with various embodiments of the present disclosure. For illustration, the operations of the device 100 in FIG. 1 are described by the method 200 with reference to FIG. 2. In some embodiments, the method 200 includes operations S210-S260.

In operation S210, during a read operation, one of the word lines WL[1]-WL[n] is activated, and a corresponding one of the switches SEL[1]-SEL[m] is turned on, in order to select a corresponding one of the memory cells 112.

In operation S220, the current ICELL, indicating the bit data of the selected memory cell 112, is transmitted from a corresponding one of the data lines DL[1]-DL[m] to the sense amplifier 132.

For illustration, as illustrated in FIG. 1, during the read operation, the first word line WL[1] is activated, the switch SEL[1] is turned on by the selection signal VSE[1], and the other switches SEL[2]-SEL[m] are turned off by the selection signals VSE[2]-VSE[m]. Accordingly, the memory cell 112 (hereinafter the selected memory cell 1121) coupled to the word line WL[1] and the data line DL[1] is selected. The switch SW of the selected memory cell 1121 is then turned on to bias the storage unit 112A of the selected memory cell 1121. Thus, the current ICELL, which is able to indicate the bit data stored in the storage unit 112A, is transmitted from the storage unit 112A to the sense amplifier 132 via the data line DL[1] and the switch SEL[1].

With continued reference to FIG. 2, in operation S230, a corresponding one of the switches RSW in the column 121A is turned on to generate the signal I1 to the average current circuit 131. In operation S240, a corresponding one of the switches RSW in the column 121B is turned on to generate the signal I2 to the average current circuit 131. In operation S250, the average current circuit 131 averages the sum of the signal I1 and the signal I2 to generate the reference signal IREF to the sense amplifier 132. In operation S260, the sense amplifier 132 compares the current ICELL with the reference signal IREF, to determine the logic state of the bit data of the selected memory cell 1121.

For illustration in FIG. 1, when the word line WL[1] is activated, the reference switches RSW in the columns 121A and 121B, which are coupled to the word line WL[1], are turned on. Accordingly, the reference storage units 122 and 123 are biased by the turn-on reference switches RSW, to generate the signals I1 and I2 to the average current circuit 131. The average current circuit 131 then averages the signals I1 and I2, to generate the reference signal IREF to the sense amplifier 132. In other words, the level of the reference signal IREF is about half of a sum of the signals I1 and I2. The sense amplifier 132 then compares the current ICELL with the reference signal IREF, to determine the logic state of the bit data of the selected memory cell 1121. For example, when the current ICELL is higher than the reference signal IREF, the bit data of the selected memory cell 1121 is determined to have the logic high state. Alternatively, when the current ICELL is lower than the reference signal IREF, the bit data of the selected memory cell 1121 is determined to have the logic low state. Effectively, the bit data of the selected memory cell 1121 is read by the electronic device 100.

The above description includes exemplary operations, but the operations are not necessarily performed in the order described. The order of the operations disclosed in the present disclosure are able to be changed, or the operations are able to be executed simultaneously or partially simultaneously as appropriate, in accordance with the spirit and scope of various embodiments of the present disclosure.

In some embodiments, the reference switches RSW and the switch SW in the n memory cells 112 are configured to have a same feature size. Thus, process/voltage/temperature variations on the memory array 110 are similar to those on the reference circuit 120, and accordingly, the reference circuit 120 is able to be utilized to detect process/voltage/temperature variations on the memory array 110. For illustration, with the arrangements of the switches RSW in FIG. 1, the reference circuit 120 is able to track the variations of the wire loading of the memory array 110, for example, including the bit lines BL[1]-B[m], the switches SW coupled to the bit lines BL[1]-BL[m], data lines DL[1]-DL[m], etc. Thus, the reference signal IREF is able to be generated with the similar variations on the memory array 110.

Compared to some approaches using an external fixed reference signal, a more accurate reference signal IREF is generated by the reference circuit 120, as illustrated in the embodiments of FIG. 1.

Moreover, in some other approaches, a reference circuit employs the same architecture of the memory array 110. In such approaches, the bit data stored in reference storage units of the reference circuit are varied with each other due to various variations between the reference storage units. As a result, the reference signal generated by the reference circuit in such approaches is inaccurate.

Compared with the approaches described above, as illustrated in FIG. 1, the reference switches RSW in the column 121A are coupled to the single reference storage unit 122, and the reference switches RSW in the column 121B are coupled to the single reference storage unit 123. Effectively, the variations between the storage units in the reference circuit 120 are minimized. As a result, a more accurate reference signal IREF is able to be generated, compared with the aforementioned approaches.

Figure 3A:
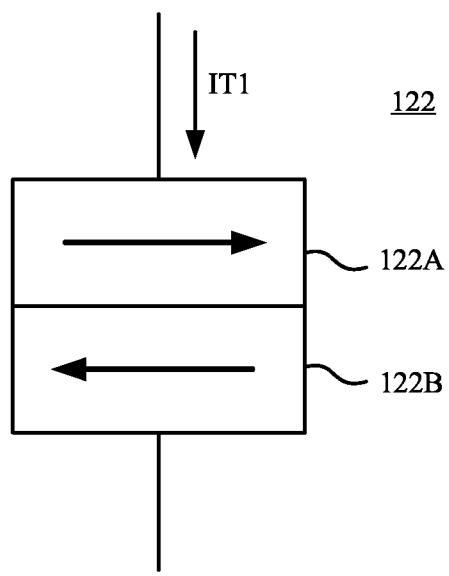
FIG. 3A is a schematic diagram of the reference storage unit in FIG. 1 having the logic high state, in accordance with various embodiments of the present disclosure.

Reference is now made to FIG. 3A. FIG. 3A is a schematic diagram of the reference storage unit 122 in FIG. 1 having the logic high state, in accordance with various embodiments of the present disclosure.

As described above, in some embodiments, the reference storage units 122 and 123 are implemented with the MTJ devices. In some embodiments, the MTJ device includes a free layer and a pinned layer. As illustratively shown in FIG. 3A, the reference storage unit 122 includes a free layer 122A and a pinned layer 123B. The free layer 122A of the reference storage unit 122 is coupled to a first terminal of the reference storage unit 122, and the pinned layer 122B is coupled to a second terminal of the reference storage unit 122. In some embodiments, the reference storage unit 122 is configured to receive a current IT1 flowing from its first terminal, i.e., the free layer 122A, to its second terminal, i.e., the pinned layer 122B. Accordingly, as shown in FIG. 3A, the magnet moment of the free layer 122A is anti-parallel to the magnet moment of the pinned layer 122B. Under this condition, the reference storage unit 122 is configured to have a high magneto resistance. Effectively, the reference storage unit 122 is programmed to have the bit data having the logic high state.

Figure 3B:
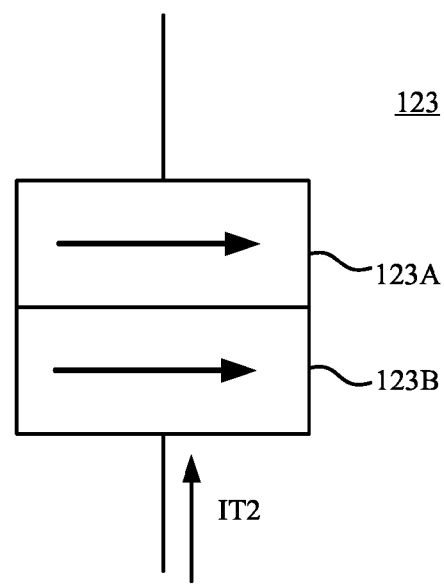
FIG. 3B is a schematic diagram of the reference storage unit in FIG. 1 having the logic low state, in accordance with various embodiments of the present disclosure.

FIG. 3B is a schematic diagram of the reference storage unit 123 in FIG. 1 having the logic low state, in accordance with various embodiments of the present disclosure. Corresponding to the reference storage unit 122, as illustrated in some embodiments in FIG. 3B, the reference storage unit 123 includes a free layer 123A and a pinned layer 123B. The free layer 123A is coupled to the first terminal of the reference storage unit 123. The pinned layer 123B is coupled to the second terminal of the reference storage unit 123. In some embodiments, the reference storage unit 123 is configured to receive a current IT2 flowing from its second terminal, i.e., the pinned layer 123B, to its second terminal, i.e., the free layer 123A. Accordingly, as shown in FIG. 3B, the magnet moment of the free layer 123A is parallel to the magnet moment of the pinned layer 123B. Under this condition, the reference storage unit 123 is configured to have a low magneto resistance. Effectively, the reference storage unit 123 is programmed to have the bit data having the logic low state.

With continued reference to both of FIG. 1, FIG. 3A, and FIG. 3B, in the embodiments illustrated in FIG. 1, the first terminal, i.e., the free layer 122A, of the reference storage unit 122 is coupled to the reference data line RDL[1], and the second terminal, i.e., the pinned layer 122B, of the reference storage unit 122 is coupled to the average current circuit 131. Furthermore, the first terminal, i.e., the free layer 123A, of the reference storage unit 123 is coupled to the reference data line RDL[2], and the second terminal, i.e., the pinned layer 123B, of the reference storage unit 123 is coupled to the average current circuit 131.

Figure 4:
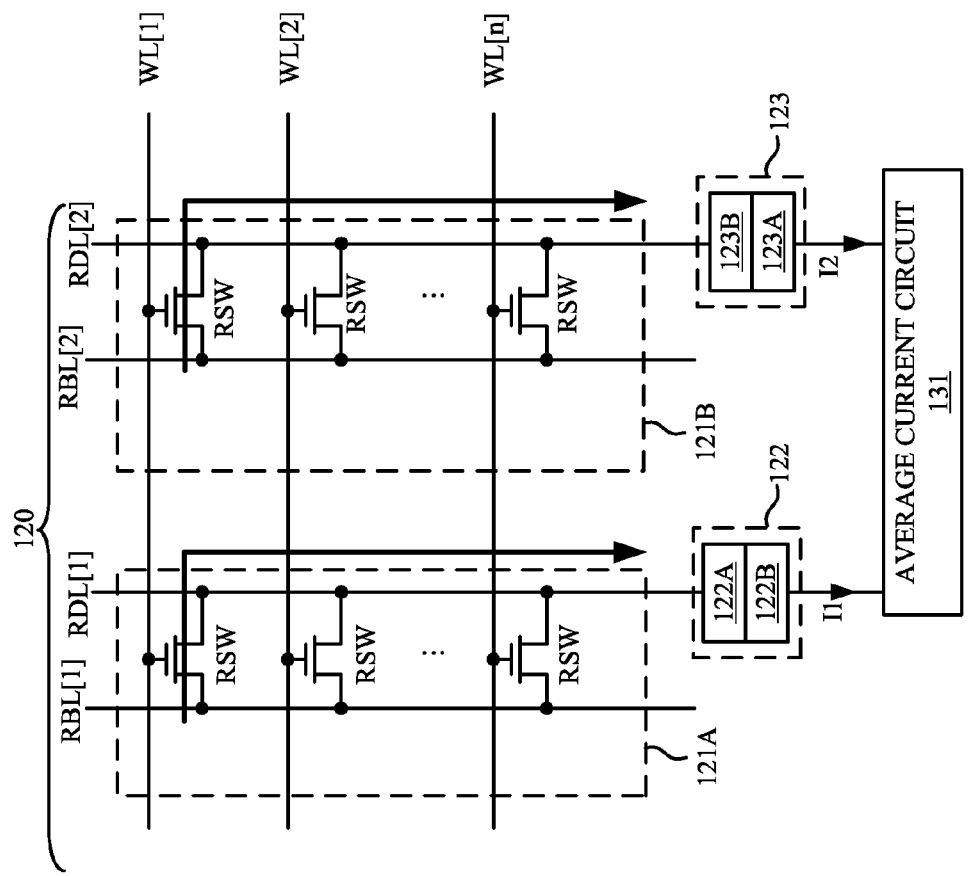
FIG. 4 is a schematic diagram of the reference circuit in FIG. 1, in accordance with some other embodiments of the present disclosure.

FIG. 4 is a schematic diagram of the reference circuit 120 in FIG. 1, in accordance with some other embodiments of the present disclosure. With respect to the embodiment of FIG. 1, like elements in FIG. 4 are designated with the same reference numbers for ease of understanding. Alternatively, in the embodiments illustrated in FIG. 4, the second terminal, i.e., the pinned layer 123B, of the reference storage unit 123 is coupled to the reference data line RDL[2], and the first terminal, i.e., the free layer 123A, of the reference storage unit 123 is coupled to the average current circuit 131. In some embodiments, the arrangement of the reference storage unit 123 in FIG. 4 is achieved in a different layout design.

As illustratively shown in FIG. 4, the current, for the read operation, flows from the pinned layer 123B to the free layer 123A. As described above in FIG. 3B, the current IT2, for the programming operation of the reference storage unit 123, also flows from the pinned layer 123B to the free layer 123A. In other words, in the embodiments illustrated in FIG. 4, the direction of the current for the read operation is the same as the direction of the current for the programming operation. Accordingly, the operational reliability is able to be further improved, compared with the embodiments illustrated in FIG. 1.

Figure 5:
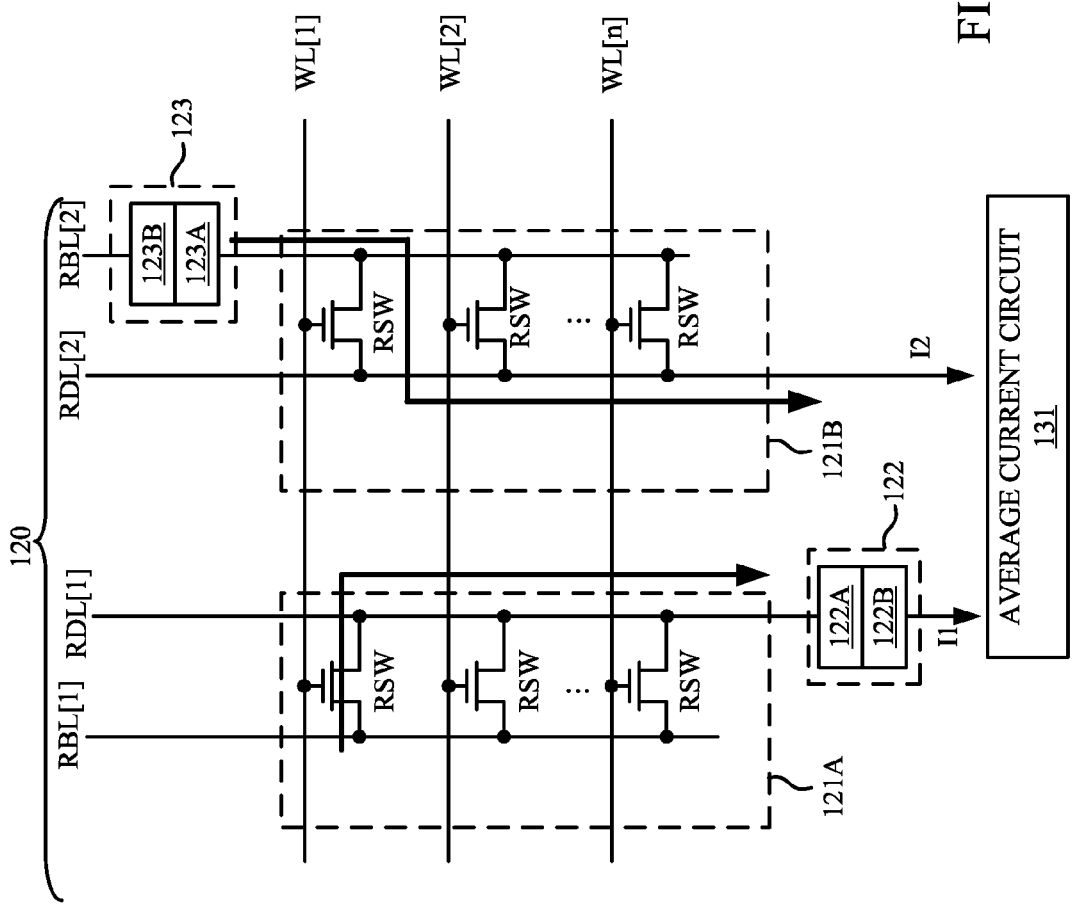
FIG. 5 is a schematic diagram of the reference circuit in FIG. 1, in accordance with some other embodiments of the present disclosure.

FIG. 5 is a schematic diagram of the reference circuit 120 in FIG. 1, in accordance with some other embodiments of the present disclosure. With respect to the embodiment of FIG. 1, like elements in FIG. 5 are designated with the same reference numbers for ease of understanding.

Compared with the reference circuit 120 in FIG. 1, in some embodiments illustrated in FIG. 5, the second terminal, i.e., the pinned layer 123B, of the reference storage unit 123 is coupled to the reference bit line RBL[2], and the first terminal, i.e., the free layer 123A, of the reference storage unit 123 is coupled to the second terminals of the reference switches RSW in the column 121B. The first terminals of the reference switches RSW in the column 121B are coupled to the reference data line RDL[2]. With such arrangements, the direction of the current for the read operation is the same as the direction of the current for the programming operation of the reference storage unit 123. As a result, the operational reliability of the electronic device 100 is further improved.

Figure 6:
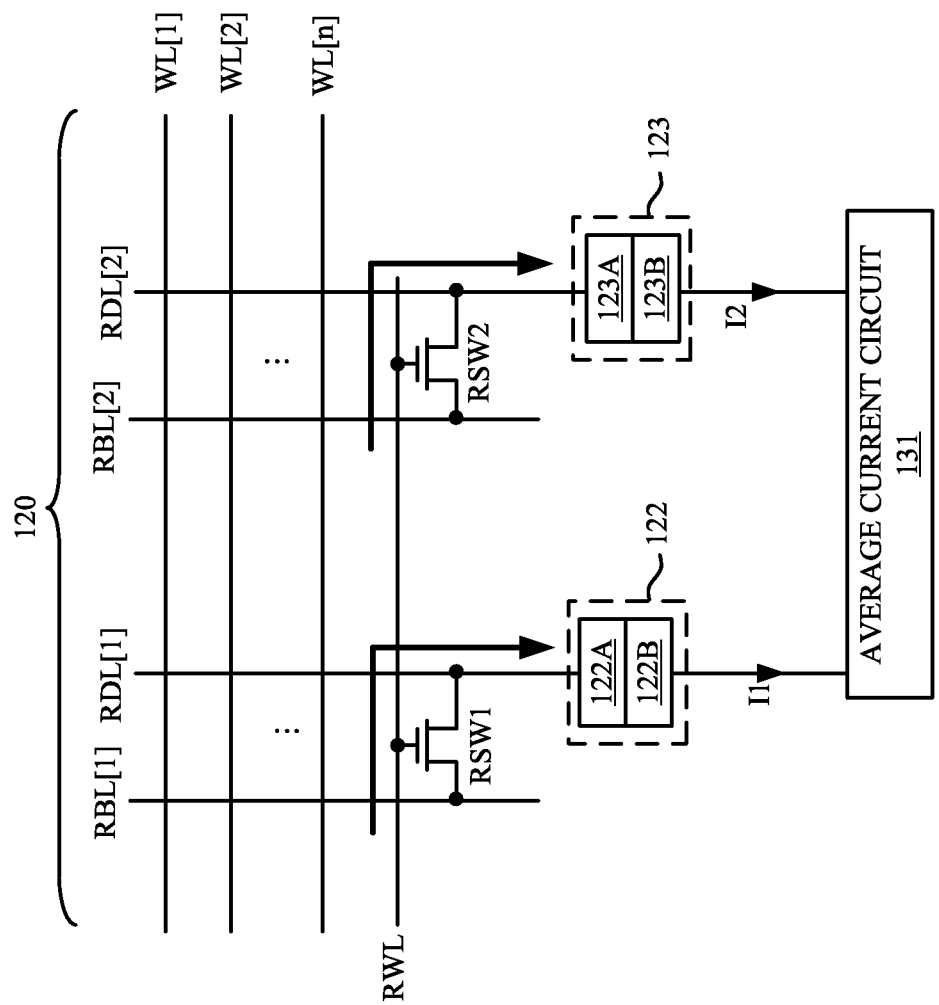
FIG. 6 is a schematic diagram of the reference circuit in FIG. 1, in accordance with still other embodiments of the present disclosure.

Reference is now made to FIG. 6. FIG. 6 is a schematic diagram of the reference circuit 120 in FIG. 1, in accordance with still other embodiments of the present disclosure. With respect to the embodiment of FIG. 1, like elements in FIG. 6 are designated with the same reference numbers for ease of understanding.

Compared with the reference circuit 120 in FIG. 1, in some embodiments illustrated in FIG. 6, the reference circuit 120 further includes a reference word line RWL, and the reference circuit 120 only utilizes two reference switches RSW1 and RSW2. For illustration, a first terminal of the reference switch RSW1 is coupled to the reference bit line RBL[1], a second terminal of the reference switch RSW1 is coupled to the first terminal of the reference storage unit 122, and a control terminal of the reference switch RSW1 is coupled to the reference word line RWL. A first terminal of the reference switch RSW2 is coupled to the reference bit line RBL[2], a second terminal of the reference switch RSW2 is coupled to the first terminal of the reference storage unit 123, and a control terminal of the reference switch RSW2 is coupled to the reference word line RWL. Second terminals of the reference switches are configured to transmit the signals I1 and I2 to the average current circuit 131.

In some embodiments, during the read operation, the reference word line RWL and one of the word lines WL[1]-WL[n] are activated at the same time, in order to transmit the current ICELL and the signals I1 and I2. Alternatively, in some other embodiments, the reference word line RWL is kept being activated. The operations of the reference circuit 120 in FIG. 6 are similar with the operations illustrated in FIG. 2, and the repetitious descriptions are thus not given here.

The configurations of the reference word line RWL is given for illustrative purposes only. Various configurations of the reference word line RWL are within the contemplated scoped of the present disclosure.

Compared with some approaches employing the same architecture of the memory array as the reference circuit, as discussed above, in the embodiments illustrated in FIG. 6, the variations between the reference storage units in the reference circuit 120 are minimized. Accordingly, a more accurate reference signal IREF is able to be generated.

Figure 7:
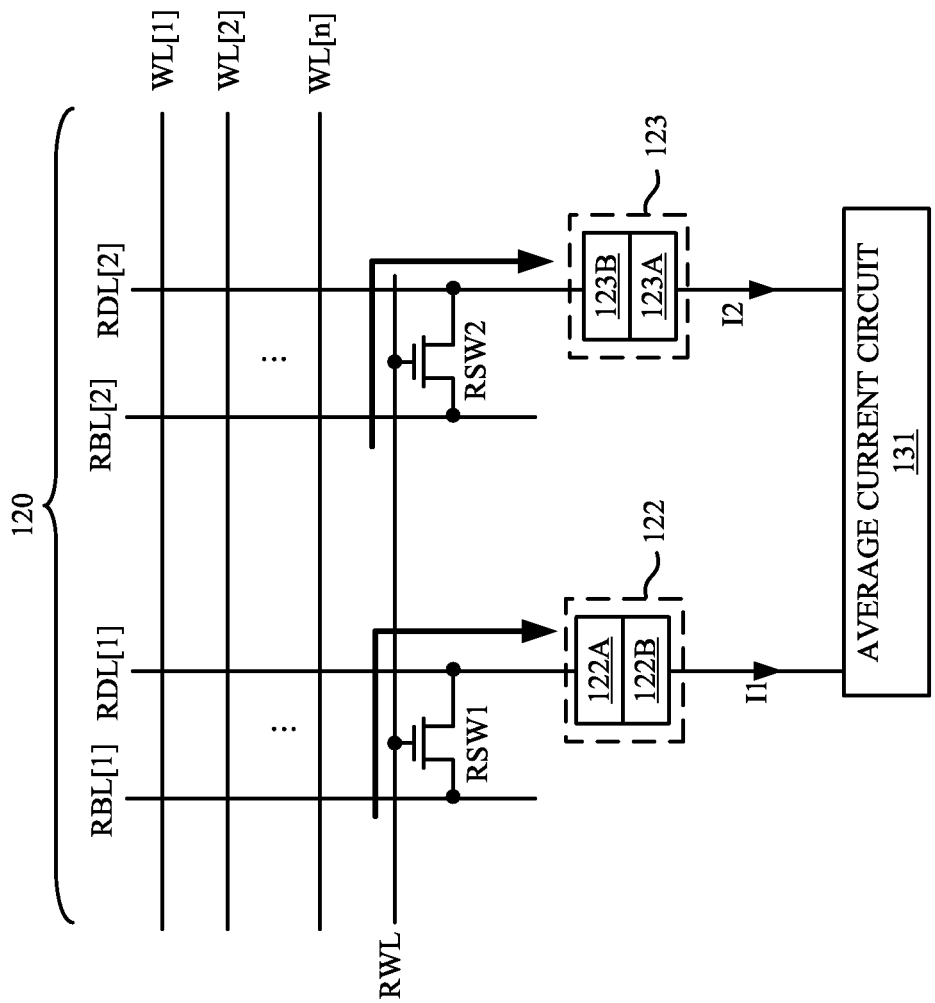
FIG. 7 is a schematic diagram of the reference circuit in FIG. 6, in accordance with various embodiments of the present disclosure.

Reference is now made to both of FIG. 3B and FIG. 7. FIG. 7 is a schematic diagram of the reference circuit 120 in FIG. 6, in accordance with various embodiments of the present disclosure. With respect to the embodiment of FIG. 1, like elements in FIG. 7 are designated with the same reference numbers for ease of understanding.

As illustrated in FIG. 3B, the reference storage unit 123 is able to be implemented with the MTJ device. Compared with the reference circuit 120 in FIG. 6, in some embodiments illustrated in FIG. 7, the second terminal, i.e. the pinned layer 123B in FIG. 3B, of the reference storage unit 123 is coupled to the second terminal of the reference switch RSW2, and the first terminal, i.e., the free layer 123A in FIG. 3B, of the reference storage unit 123 is coupled to the average current circuit 131. As described above, with such arrangements, the direction of the current for the read operation is the same as the direction of the current for the programming operation of the reference storage unit 123. As a result, the operational reliability of the electronic device 100 is further improved.

Figure 8:
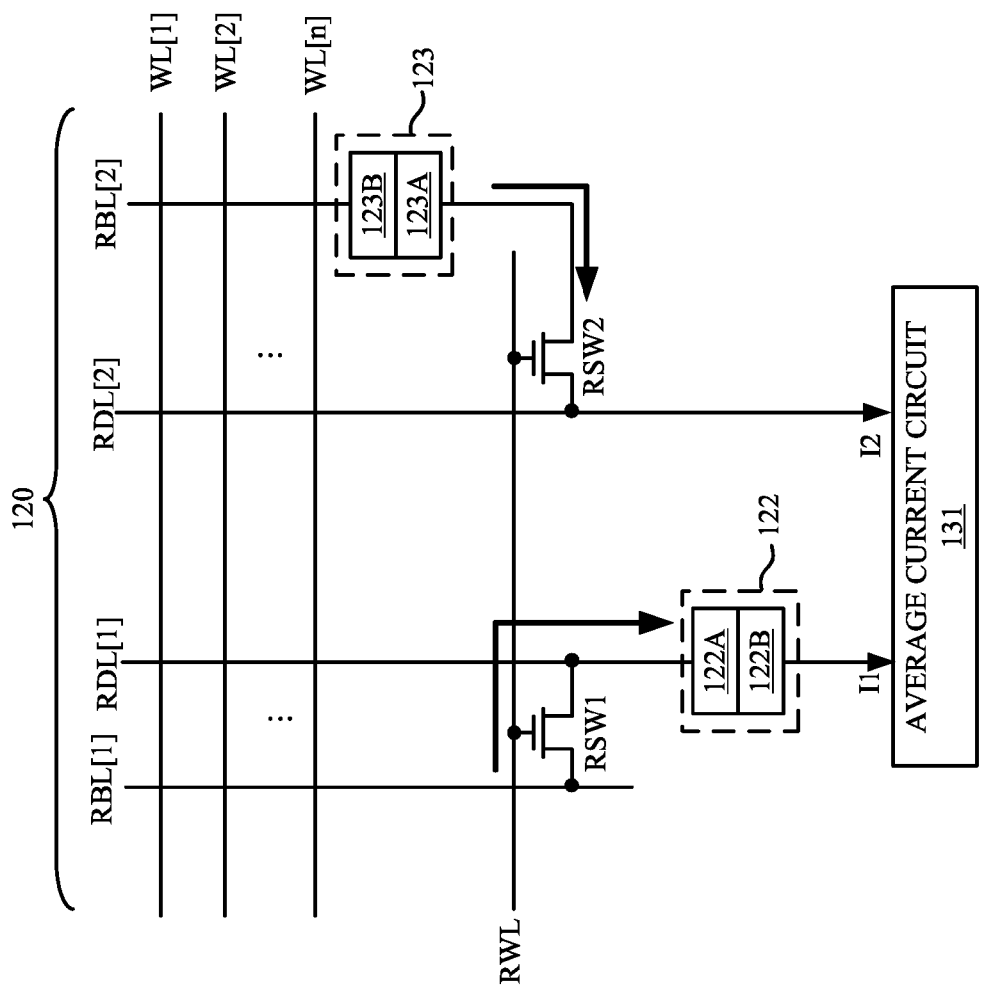
FIG. 8 is a schematic diagram of the reference circuit in FIG. 6, in accordance with various embodiments of the present disclosure.

Reference is now made to both of FIG. 3B and FIG. 8. FIG. 8 is a schematic diagram of the reference circuit 120 in FIG. 6, in accordance with various embodiments of the present disclosure. With respect to the embodiment of FIG. 1, like elements in FIG. 8 are designated with the same reference numbers for ease of understanding.

Compared with the reference circuit 120 in FIG. 6, in some embodiments illustrated in FIG. 8, the second terminal, i.e., the pinned layer 123B, of the reference storage unit 123 is coupled to the reference bit line RBL[2], and the first terminal, i.e., the free layer 123A, of the reference storage unit 123 is coupled to the second terminal of the reference switch RSW2. The first terminal of the reference switch RSW2 is coupled to the reference data line RDL[2]. With such arrangements, the direction of the current for the read operation is the same as the direction of the current for the programming operation of the reference storage unit 123. As a result, the operational reliability of the electronic device 100 is improved.

As described above, the device 100 in the present disclosure is able to generate a reference signal to be compared with the bit data. Moreover, with the arrangements of the reference circuit illustrated in various embodiments, a more accurate reference signal is generated. Accordingly, the operational reliability of the memory device is able to be improved.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a device is disclosed that includes memory cells, a reference circuit, and a sensing unit. Each of the memory cells is configured to store bit data. The reference circuit includes reference switches and reference storage units. The reference switches are disposed in rows and columns. A first reference storage unit of the reference storage units is configured to generate a first signal having a first logic state when one of the reference switches in a first column is turned on. A second reference storage unit of the reference storage units is configured to generate a second signal having a second logic state when one of the reference switches in a second column is turned on. The sensing unit is configured to determine a logic state of the bit data of one of the memory cells according to the first signal and the second signal.

Also disclosed is a device that includes memory cells, a reference circuit, and a sensing unit. Each of the memory cells is configured to transmit bit data when a corresponding one of word lines is activated. The reference circuit includes a first reference switch, a second reference switch, and reference storage units. The first reference switch is configured to be turned on when a reference word line is activated. The second reference switch is configured to be turned on when the reference word line is activated. The reference storage units include a first reference storage unit and a second reference storage unit. The first reference storage unit is configured to generate a first signal having a first logic state when the first reference switch is turned on. The second reference storage unit is configured to generate a second signal having a second logic state when the second reference switch is turned on. The sensing unit is configured to determine a logic state of the bit data of one of the memory cells according to the first signal and the second signal.

Also disclosed is a method that includes the operation below. A first signal having a first logic state is generated by a first reference storage unit when one of a plurality of the word lines and a reference word line is activated. A second signal having a second logic state is generated by a second reference storage unit when the one of the word lines and the reference word line is activated. A logic state of bit data of one of memory cells is determined by a sensing unit according to the first signal and the second signal, in which the memory cells are coupled to the word lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
  a plurality of memory cells coupled to a data line, each of the memory cells being configured to store bit data;
  a reference circuit, comprising:
    a plurality of reference switches; and
    a plurality of reference storage units,
    wherein
      a first reference storage unit of the reference storage units is configured to generate a first signal having a first logic state via a first reference data line, in a condition that a first reference switch of the reference switches is turned on, and
      a second reference storage unit of the reference storage units is configured to generate a second signal having a second logic state via a second reference data line, in a condition that a second reference switch of the reference switches is turned on; and
  a sensing unit configured to determine a logic state of the bit data of one of the memory cells according to the first signal and the second signal,
  wherein a number of the reference switches which are coupled to one of the first reference data line or the second reference data line is the same as a number of the memory cells coupled to the data line.

2. The device of claim 1, wherein the reference switches comprises a first group and a second group, the first group is coupled between a first reference bit line and the first reference data line, the second group is coupled between a second reference bit line and the second reference data line.

3. The device of claim 2, wherein each of the reference switches of the first group is configured to be turned on to bias the first reference storage unit, to generate the first signal,
  wherein each of the reference switches of the second group is configured to be turned on to bias the second reference storage unit, to generate the second signal.

4. The device of claim 2, wherein each of the reference storage units comprises a first terminal and a second terminal, each of the reference storage units is configured to receive a first current flowing from the first terminal to the second terminal, to store first bit data having the first logic state, and receive a second current flowing from the second terminal to the first terminal to store second bit data having the second logic state.

5. The device of claim 4, wherein the first terminal of the first reference storage unit is coupled to the first reference data line, and the second terminal of the first reference storage unit is configured to generate the first signal;
  wherein the first terminal of the second reference storage unit is coupled to the second reference data line, and the second terminal of the second reference storage unit is configured to generate the second signal.

6. The device of claim 4, wherein the first terminal of the first reference storage unit is coupled to the first reference data line, and the second terminal of the first reference storage unit is configured to generate the first signal;
  wherein the second terminal of the second reference storage unit is coupled to the second reference bit line, the first terminal of the second reference storage unit is coupled to first terminals of the reference switches of the second group, and second terminals of the reference switches of the second group are coupled to the second reference data line to output the second signal.

7. The device of claim 1, wherein the sensing unit comprises:
  an average current circuit configured to average the first signal and the second signal to generate a reference signal; and
  a sense amplifier configured to determine the logic state of the bit data of the one of the memory cells according to the reference signal.

8. The device of claim 1, further comprising:
  a plurality of word lines coupled to the reference switches and the memory cells, respectively;
  wherein when one of the word lines is activated, the first reference switch is turned on to generate the first signal, and the second reference switch is turned on to generate the second signal.

9. A method comprising:
  generating, by a first reference storage unit, a first signal having a first logic state via a first reference data line in a condition that a first reference switch of a plurality of reference switches is turned on;
  generating, by a second reference storage unit, a second signal having a second logic state via a second reference data line in a condition that a second reference switch of the reference switches is turned on; and
  determining, by a sensing unit, a logic state of bit data of a corresponding memory cell of a plurality of memory cells coupled to a data line according to the first signal and the second signal,
  wherein a number of the reference switches which are coupled to one of the first reference data line or the second reference data line is the same as a number of the memory cells coupled to the data line.

10. The method of claim 9, wherein the first reference switch, the second reference switch, and the corresponding memory cell are coupled to a word line, and the method further comprises:
  activating the word line to turn on the first reference switch and the second reference switch.

11. The method of claim 9, wherein generating the first signal comprises:
  biasing, by the first reference switch, the first reference storage unit to generate the first signal.

12. The method of claim 9, wherein generating the second signal comprises:
  biasing, by the second reference switch, the second reference storage unit to generate the second signal.

13. The method of claim 9, wherein determining the logic state of the bit data comprises:
  averaging, by an average current circuit of the sensing unit, the first signal and the second signal to generate a reference signal; and
  determining, by a sense amplifier of the sensing unit, the logic state of the bit data of the corresponding memory cell according to the reference signal.

14. The method of claim 13, further comprises:
turning on a switch that is coupled between the memory cells and the sensing unit, to receive a current indicating the bit data of the corresponding memory cell,
wherein the sense amplifier is configured to compare the reference signal with the current to determine the logic state of the bit data.

15. A device, comprising:
a plurality of memory cells coupled to a data line, wherein each of the memory cells is configured to store bit data;
a plurality of reference switches;
a plurality of reference storage units configured to be biased by the reference switches to generate a first signal via a first reference data line and to generate a second signal via a second reference data line, wherein the first signal and the second signal have different logic states, and a number of the reference switches which are coupled to one of the first reference data line or the second reference data line is the same as a number of the memory cells coupled to the data line; and
a sensing unit configured to determine a logic state of the bit data of the memory cell according to the first signal and the second signal.

16. The device of claim 15, wherein each of the reference storage units is implemented with a magnetic tunnel junction (MTJ) device.

17. The device of claim 16, wherein the MTJ device comprises a free layer and a pinned layer, and the reference storage units comprises:

a first reference storage unit configured to receive a first current flowing from the free layer to the pinned layer of the first reference storage unit, to store first bit data having a first logic state; and
a second reference storage unit configured to receive a current flowing from the pinned layer to the free layer of the second reference storage unit, to store second bit data having a second logic state that is different from the first logic state.

18. The device of claim 15, wherein a first reference storage unit of the reference storage units is coupled between first reference switches of the reference switches and the sensing unit.

19. The device of claim 18, wherein a second reference storage unit of the reference storage units is coupled between second reference switches of the reference switches and the sensing unit, or the second reference switches are coupled between the second reference storage unit and the sensing unit.

20. The device of claim 15, wherein the sensing unit comprises:
an average current circuit configured to average the first signal and the second signal to generate a reference signal; and
a sense amplifier configured to compare the reference signal with a current indicating the bit data of the memory cell, to determine the logic state of the bit data of the memory cell.

* * * * *